(12) United States Patent
Matsuda

(10) Patent No.: US 6,329,230 B1
(45) Date of Patent: Dec. 11, 2001

(54) HIGH-SPEED COMPOUND SEMICONDUCTOR DEVICE HAVING AN IMPROVED GATE STRUCTURE

(75) Inventor: Hajime Matsuda, Yamanashi (JP)

(73) Assignee: Fujitsu Quantum Devices Limited, Yamanashi (JP)

( * ) Notice: Subject to any disclaimer, the term of this patent is extended or adjusted under 35 U.S.C. 154(b) by 0 days.

(21) Appl. No.: 09/547,902

(22) Filed: Apr. 11, 2000

Related U.S. Application Data

(62) Division of application No. 09/328,396, filed on Jun. 9, 1999, now Pat. No. 6,078,071.

(30) Foreign Application Priority Data

Jun. 11, 1998 (JP) .................................................. 10-163832

(51) Int. Cl.[7] ........................ H01L 21/338; H01L 21/336
(52) U.S. Cl. ........................... 438/167; 438/304; 438/305
(58) Field of Search ....................... 438/167, 305, 438/182, 304

(56) References Cited

U.S. PATENT DOCUMENTS

| | | | |
|---|---|---|---|
| 4,845,534 | * 7/1989 | Fukuta | 357/15 |
| 4,975,385 | * 12/1990 | Beinglass et al. | 437/44 |
| 5,220,186 | 6/1993 | Kasai et al. | 257/284 |
| 5,550,065 | * 8/1996 | Hashemi et al. | 437/39 |
| 5,648,668 | * 7/1997 | Kasai | 257/280 |
| 5,672,890 | * 9/1997 | Nakajima | 257/192 |
| 5,675,159 | 10/1997 | Oka et al. | 257/284 |
| 5,834,817 | * 11/1998 | Satoh et al. | 257/387 |
| 5,942,773 | 8/1999 | Kaneko | 257/280 |
| 6,078,071 | * 6/2000 | Matsuda | 257/280 |

OTHER PUBLICATIONS

Nishimura, K., et al., IEEE Transactions On Electron Devices, vol. 44, No. 11, Nov. 1997, pp. 2113–2119.

* cited by examiner

Primary Examiner—John F. Niebling
Assistant Examiner—Walter L. Lindsay, Jr.
(74) Attorney, Agent, or Firm—Armstrong, Westerman, Hattori, McLeland & Naughton, LLP

(57) ABSTRACT

A semiconductor device includes a gate structure formed on a substrate in which an LDD structure is formed, wherein gate structure includes a Schottky electrode making a Schottky contact with a channel region in the substrate, a low-resistance layer provided above the Schottky electrode, and a stress-relaxation layer interposed between the Schottky electrode and the stress-relaxation layer. The low-resistance layer and said stress-relaxation layer form an overhang structure with respect to the Schottky electrode.

4 Claims, 11 Drawing Sheets

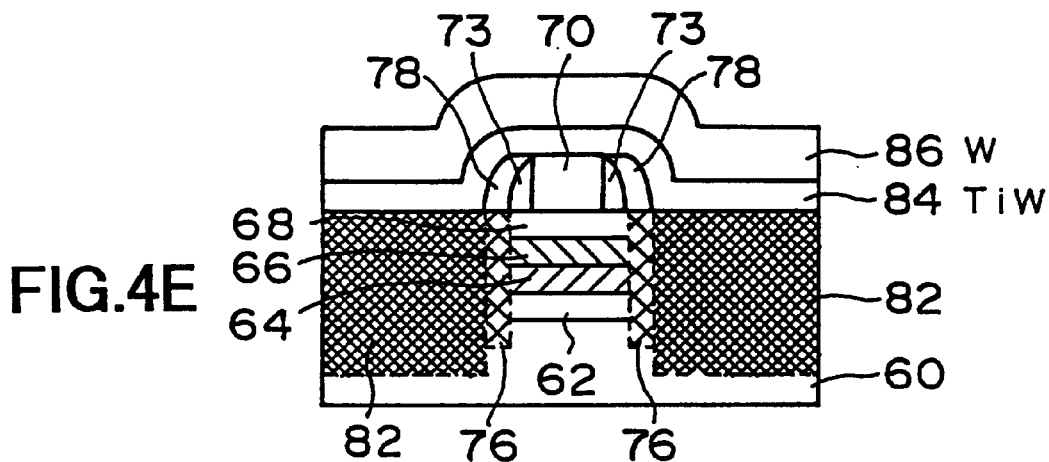
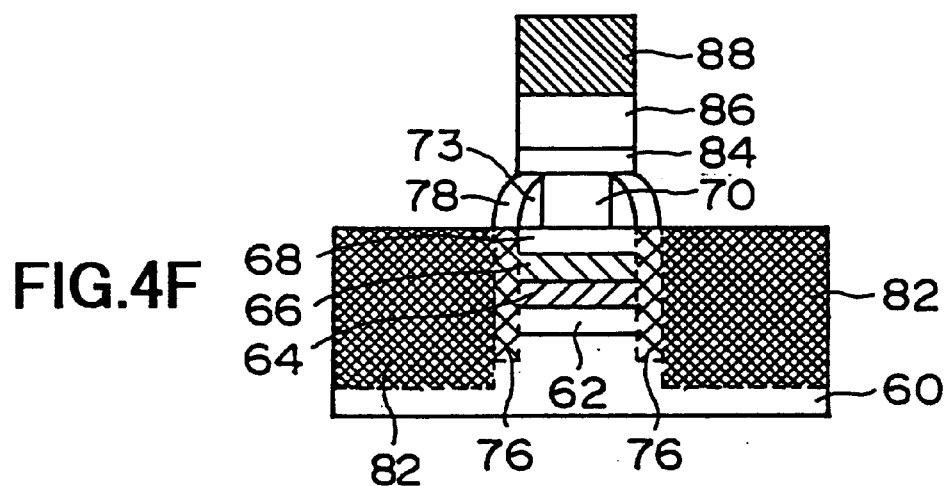
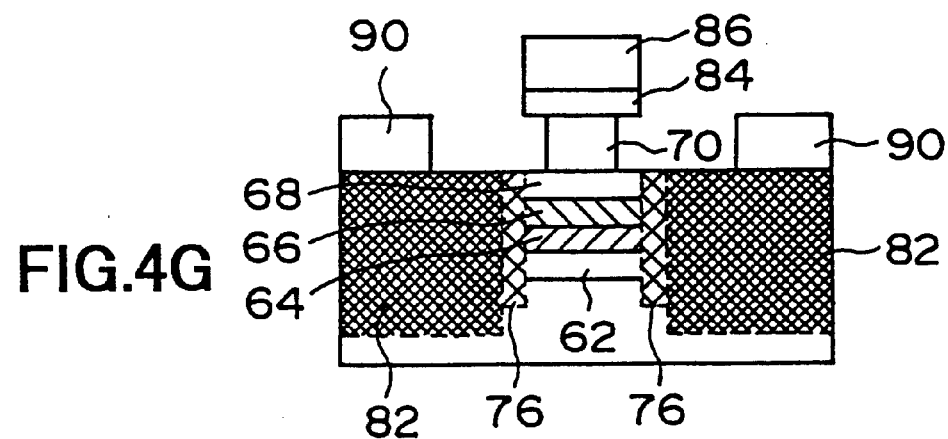

HIGH-SPEED COMPOUND SEMICONDUCTOR DEVICE HAVING AN IMPROVED GATE STRUCTURE

This application is a divsional application of prior a application Ser. No. 09/328,396 filed Jun. 9,1999 now U.S. Pat. No. 6,078,071.

BACKGROUND OF THE INVENTION

The present invention generally relates to semiconductor devices and more particularly to a high-speed compound semiconductor device having an LDD (lightly doped drain) structure in combination with a low-resistance electrode provided on a gate electrode.

A compound semiconductor device having a gate electrode of a refractory metal has an advantageous feature of high operational speed and is used extensively in compound semiconductor integrated circuits for use in ultra-high frequency applications such as mobile telephony. A representative example of the mobile telephony includes portable telephones. Further, such a compound semiconductor device is advantageous in that the diffusion region can be formed relatively easily by a self-alignment process. Further, the feature of using a refractory metal for the gate electrode is advantageous in conducting a thermal diffusion process for forming a diffusion region.

Meanwhile, with the development of telecommunication technology, the analog devices and digital devices used in such ultra-high frequency applications are required to have the feature of higher operational speed and lower power consumption.

The desired increase of the operational speed is most conveniently achieved by reducing the gate length of the compound semiconductor device. On the other hand, such a decrease of gate length invites the problem of increase in the gate resistance as a result of the decrease of the cross-sectional area of the gate electrode associated with the device miniaturization. While it is generally practiced in the art to use a refractory metal silicide such as WSi for the material of the gate electrode in view of high-quality Schottky contact formed between the refractory metal silicide and a compound semiconductor substrate and further in view of the refractory nature of the refractory metal silicide, it is nevertheless desired to reduce the resistivity of the refractory metal silicide gate electrode further. It should be noted that WSi has a relatively large resistivity of about $2 \times 10^{-4} \Omega \cdot cm$. A similar situation holds also in other silicides of refractory elements. Further, in such a high-speed semiconductor device having a reduced gate length, it is desired to employ the so-called LDD structure for suppressing the problem of short channel effect.

In order to reduce the gate resistance in such high-speed compound semiconductor devices, there is a proposal to construct the gate electrode in two layers, the first layer being a Schottky electrode layer and the other layer being a low-resistance layer. In one example, it is proposed to form the low-resistance layer on a WSi Schottky electrode layer after conducting a thermal annealing process such as a thermal diffusion process. Alternatively, there is a proposal to deposit a WSi Schottky electrode and a low-resistance layer consecutively to form a substantially single electrode having a multiple layer structure.

In the former approach, it is possible to use a low-melting metal such as Au for the low-resistance layer. On the other hand, this former approach has a drawback in that the number of fabrication steps of the semiconductor device is increased substantially as a result of the addition of the process of forming the low-resistance layer separately from the process of forming the Schottky electrode.

In the latter approach, on the other hand, it is possible to form the multiple-layer gate structure by a single patterning process and the fabrication of the semiconductor device is conducted similarly to the case of using a single-layer gate electrode. On the other hand, the latter approach has a drawback in that there tends to occur a thermal stress in the gate electrode as a result of the difference in the thermal expansion coefficients between the Schottky electrode and the low-resistance layer, while such a thermal stress induces a deterioration in the FET performance of the device. Further, the thermal stress tends to cause an exfoliation of the low-resistance electrode layer from the Schottky electrode layer.

In order to overcome the foregoing problems of the latter approach, there is a further proposal, as disclosed in the Japanese Laid-Open Patent Publication 2-234442, to interpose a stress-relaxation layer between the low-resistance electrode layer and the Schottky electrode layer.

FIGS. 1A–1D show the fabrication process of a MESFET according to the disclosure of the foregoing Japanese Laid-Open Patent Publication 2-234442.

Referring to FIG. 1A, a GaAs layer 2 of the n-type is formed on a semi-insulating GaAs substrate 1 by an MOVPE process or an MBE process, and a Schottky electrode layer 3 of WSi and a stress-relaxation layer 4 of $LaB_6$ are deposited consecutively on the GaAs layer 2. Further, a low-resistance layer 5 of W is deposited on the stress-relaxation layer 4.

Next, in the step of FIG. 1B, the low-resistance layer 5 of W is patterned to form a W pattern designated hereinafter by the reference 5, on the stress-relaxation layer 4, and an ion implantation process of $Si^+$ is conducted, in the step of FIG. 1C, into the GaAs substrate 1 through the $LaB_6$ stress-relaxation layer 4 and further through the WSi Schottky electrode layer 3, while using the W pattern 5 as a mask. The Si ions thus introduced are activated by a thermal diffusion process, wherein the thermal diffusion process is conducted in the state that the WSi layer 3 and the $LaB_6$ layer 4 cover the substrate 1. As a result of the thermal diffusion process, diffusion regions 6 of the n-type are formed in the substrate 1.

In the step of FIG. 1D, the stress-relaxation layer 4 of $LaB_6$ is patterned by an ion milling process using Ar, and the WSi Schottky electrode layer 3 is patterned by a dry etching process while using the $LaB_6$ stress-relaxation layer 4 and the W low-resistance layer 5 thereon as a mask. Further, ohmic electrodes 7 are formed in ohmic contact with the diffusion regions 6 at both lateral sides of the gate structure that includes the stacking of the WSi Schottky electrode layer 3, the $LaB_6$ stress-relaxation layer 4 and the W low-resistance layer 5.

In the conventional process of FIGS. 1A–1D, on the other hand, there arises a problem in that the formation of the LDD structure in the substrate 1 is difficult.

In the process of FIGS. 1A–1D, it should be noted that an $n^+$-type region is formed in the p-type substrate 1 in correspondence to the source and drain regions when forming an n-channel FET, while it should be noted that such a structure, characterized by a sharp change of impurity concentration level between the p-type region of the substrate 1 and the diffusion region 6, tends to suffer from the problem of hot carrier formation during the FET operation as a result of the large electric field induced in the vicinity of the drain edge. When this problem occurs, the operational performance of the FET is deteriorated inevitably.

In order to overcome the foregoing problems, it is practiced to use an LDD structure in the FETs having such a short gate length, wherein an LDD structure includes an $n^-$-type region having a reduced impurity concentration level between the p-channel region of the substrate 1 and the $n^+$-type diffusion region 6 for relaxing the concentration of the electric field. Such an LDD structure is essential in such a high-speed FET having a short gate length for suppressing the short channel effect.

In the foregoing conventional process, on the other hand, the impurity ions are injected into the substrate 1 through the WSi Schottky electrode layer 3 and the $LaB_6$ stress-relaxation layer 4. In such a process, it should be noted that the process window for an appropriate acceleration energy of ion implantation is extremely small, and a minute deviation in the film thickness of the layers 3 and 4 induces a substantial deviation in the thickness of the junction formed in the substrate 1. This means that the foregoing conventional process is not suitable for forming a shallow $n^-$-type diffusion region used in the LDD structure.

In order to form a shallow diffusion region, it is necessary to reduce the thickness of the layer 3 or 4 as much as possible, while there arises a problem that the desired high-quality Schottky electrode is not obtained when the thickness of the WSi layer 3 is reduced. When the thickness of the $LaB_6$ stress-relaxation layer 4 is reduced, on the other hand, the effect of the stress-relaxation becomes poor and inefficient.

In the conventional fabrication process, it should also be noted that the gate width of the gate structure including the W layer 5 becomes small when the gate length is reduced to submicron or quarter submicron lengths. When this occurs, the cross-sectional area of the gate structure becomes also small and there occurs an increase of the gate resistance even in such a case in which the gate structure includes the W low-resistance layer 5. In other words, the effect of the W low-resistance layer 5 for reducing the gate resistance is diminished.

In order to overcome this problem, it is practiced to form the gate structure to have a T-shaped form in which the low-resistance layer 5 forms an overhang structure extending laterally on the Schottky electrode layer 3.

When this T-shaped gate structure is to be formed in the conventional process of FIGS. 1A–1D, it is necessary to conduct a lateral or side etching of the WSi layer 3 selectively with respect to the rest of the layers 4 and 5. Because of the insufficient selectively of etching rate between the WSi layer 3 and the W layer 5, however, it is difficult to form the desired T-shaped gate structure according to the foregoing conventional process.

Further, even when the T-shaped gate structure is formed successfully by the lateral etching process of the WSi layer 3, the gate length of such a T-shaped gate structure tends to vary variously, while such a change in the gate length induces a variation of the threshold voltage of the FET. As the control of the gate length by the lateral etching is difficult, the control of the threshold voltage is also difficult.

In addition, the foregoing conventional fabrication process has a further drawback, when mass-producing FETs, in that the inspection of the gate length of the fabricated device is difficult. It should be noted that there is no way to inspect the gate length during the fabrication process of the device and the confirmation of the gate length of the actual device is only possible by a microscopic observation of the cross-section conducted for a completed semiconductor device.

It is generally known that a Schottky junction tends to show a poor performance when the impurity concentration level in the semiconductor layer is high. Because of this, it is practiced in conventional MESFETs to improve the forward-bias performance of the Schottky junction and to improve the reverse withstand voltage thereof by providing a separation between the gate electrode and the $n^-$-type region forming an LDD structure together with the $n^+$-type region. However, the foregoing conventional process, which relies on the injection of impurity ions via the $LaB_6$ stress-relaxation layer 4 and further through the WSi Schottky electrode layer 3, is not suitable for exact control of the lateral spreading of the injected impurity ions, and it has been difficult to secure the necessary performance for the Schottky electrode.

SUMMARY OF THE INVENTION

Accordingly, it is a general object of the present invention to provide a novel and useful semiconductor device and a fabrication process thereof wherein the foregoing problems are eliminated.

Another and more specific object of the present invention is to provide a semiconductor device, comprising:

a substrate;

a channel region of a compound semiconductor material formed in a surface part of said substrate;

a gate structure formed on said channel region;

a pair of first diffusion regions formed in said surface part of said substrate at both lateral sides of said channel region, each of said first diffusion regions containing an impurity element with a first concentration level; and a pair of second diffusion regions formed in said surface part of said substrate at respective outer sides of said first diffusion regions, each of said second diffusion regions containing said impurity element with a second concentration level higher than said first concentration level;

said gate structure including a Schottky electrode making a Schottky contact with said channel region, a low-resistance layer provided above said Schottky electrode, and a stress-relaxation layer interposed between said Schottky electrode and said low-resistance layer, said low-resistance layer and said stress-relaxation layer forming an overhang structure with respect to said Schottky electrode.

According to the present invention, the short-channel effect is successfully suppressed even in such a case the gate length of the semiconductor device is reduced substantially, by forming an LDD structure by the first and second diffusion regions. By providing the stress-relaxation layer between the Schottky electrode and the low-resistance layer, the problem of degradation of performance of the semiconductor device, caused by the stress induced between the Schottky electrode and the low-resistance layer, is eliminated. Further, by forming the low-resistance layer and the stress-relaxation layer to form an overhang structure, the problem of increase of the gate resistance, which is caused as a result of the decrease of the gate width, is successfully avoided. Further, such an overhang structure is formed without a lateral etching process and the problem of variation of the threshold voltage associated with the variation of the gate length is successfully avoided.

Another object of the present invention is to provide a method of fabricating a semiconductor device, comprising the steps of:

forming a gate electrode on a substrate;

introducing a first impurity element into said substrate while using said gate electrode as a mask;

forming a first side-wall insulation film on said gate electrode so as to cover a side wall thereof;

introducing a second impurity element, identical in conductivity type with said first impurity element, into said substrate while using said gate electrode and said first side-wall insulation film as a mask;

depositing, on said gate electrode and said side-wall insulation film, a stress-relaxation layer and a low-resistance layer consecutively; and patterning said stress-relaxation layer and said low-resistance layer such that said stress-relaxation layer and said low-resistance layer form an overhang with respect to said gate electrode.

According to the present invention, it is possible to form an overhang structure on the gate electrode from the stress-relaxation layer and the low-resistance layer, without using a lateral etching process of the gate electrode, and the gate resistance of the semiconductor device is minimized successfully. Further, the gate length of the semiconductor device is controlled by the patterning process of the gate electrode, and the problem of variation of the threshold voltage of the semiconductor device associated with the lateral etching process is successfully avoided.

Another object of the present invention is to provide a method of fabricating a compound semiconductor device comprising the steps of:

forming a gate electrode on a substrate;

forming a pair of side-wall insulation films on both side walls of said gate electrode;

forming a pair of first diffusion regions in said substrate by introducing a first impurity element by an ion implantation process while using said gate electrode and said side-wall insulation films as a mask;

forming a pair of second diffusion regions in said substrate respectively at both sides of said gate electrode with a separation from a corresponding side-wall insulation film, such that each of said second diffusion regions overlaps partially with a corresponding first diffusion region, said step of forming said second diffusion regions including a step of introducing a second impurity element of a conductivity type identical with a conductivity type of said first impurity element while using a mask covering said gate electrode and said pair of side-wall insulation films, said mask being formed such that a first region of said first diffusion region located at a first side in a gate-length direction with respect to said gate electrode has a size different from a size of a second region of said first diffusion region located at a second, opposite side of said gate electrode.

According to the present invention, it is possible to form an asymmetric LDD structure in a high-speed semiconductor device. Thereby, it becomes possible to reduce the source resistance by reducing the size of the n⁻-type diffusion region adjacent to the n⁺-type source region or suppress the creation of hot carriers by increasing the size of the n⁻-type diffusion region adjacent to the n⁺-type drain region.

Another object of the present invention is to provide a method of fabricating a semiconductor device, comprising the steps of:

forming a gate electrode on a substrate by depositing a metal layer forming a Schottky contact with said substrate, a stress-relaxation layer and a low-resistance layer consecutively;

introducing a first impurity element into said substrate while using said gate electrode as a mask;

forming a side-wall insulation film on a side wall of said gate electrode; and introducing a second impurity element having an identical conductivity type with a conductivity type of said first impurity element while using said gate electrode and said side-wall insulation film as a mask.

According to the present invention, the ion implantation of the first and second impurity elements is conducted while using the gate electrode and the side-wall insulation film in the fabrication process of a semiconductor device in which the gate electrode includes a stress-relaxation layer. Thereby, the problem associated with the conventional process of forming a shallow diffusion region by an ion implantation process conducted through the foregoing metal layer and the stress-relaxation layer, is successfully eliminated and the semiconductor device having an LDD structure with a shallow diffusion region is formed with high reproducibility and high yield.

Other objects and further features of the present invention will become apparent from the following detailed description when read in conjunction with the attached drawings.

BRIEF DESCRIPTION OF THE DRAWINGS

FIGS. 4A–4G are diagrams showing a fabrication process of a semiconductor device according to a second embodiment of the present invention;

DETAILED DESCRIPTION OF THE PREFERRED EMBODIMENTS

[PRINCIPLE]

FIGS. 2A–2E show the principle of the present invention.

Figure 1A:
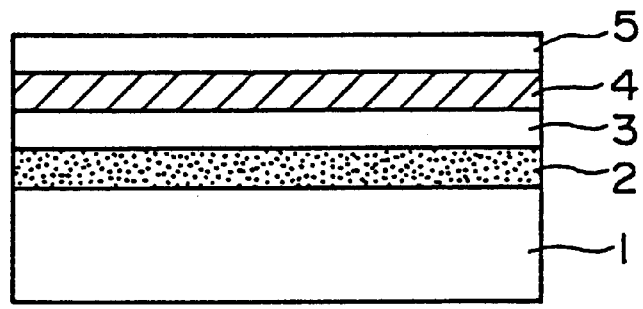
FIGS. 1A–1D are diagrams showing a conventional fabrication process of a compound semiconductor device that includes a stress-relaxation layer.
Figure 1B:
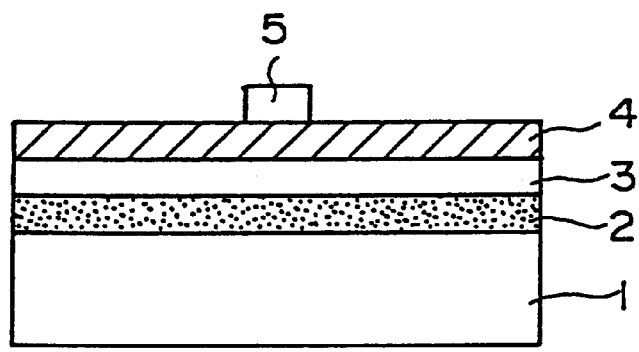
Figure 1C:
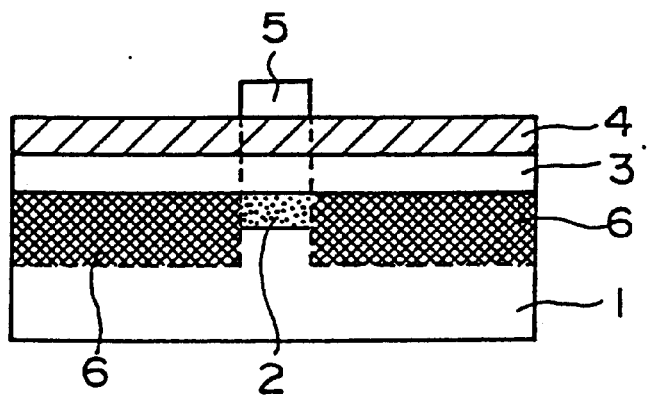
Figure 1D:
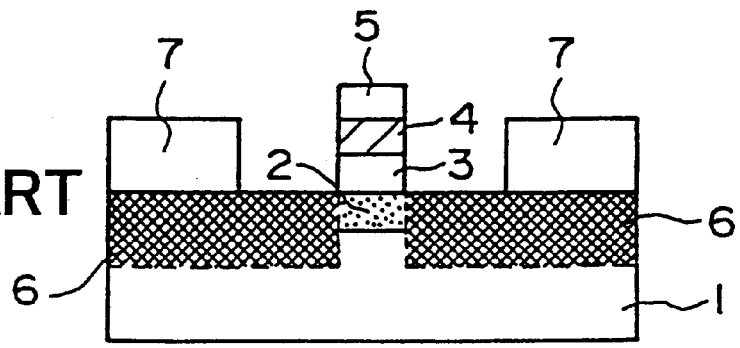
Figure 2A:
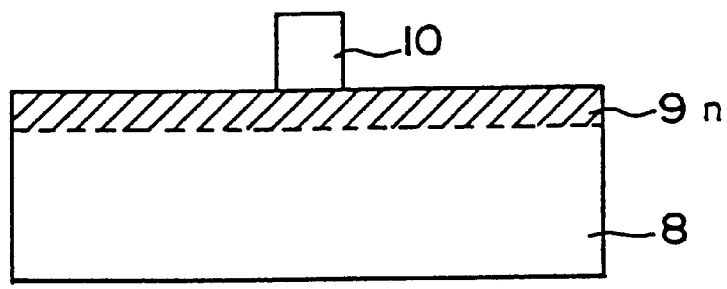
FIGS. 2A–2E are diagrams showing the principle of the present invention.

Referring to FIG. 2A, an n-type GaAs layer 9 is formed on a semi-insulating GaAs substrate 8 by an ion implantation process of $Si^+$ or by an epitaxial growth of the n-type GaAs layer 9 conducted by an MOVPE process of MBE process, and a Schottky electrode 10 of WSi is formed on the GaAs layer 9.

Figure 2B:
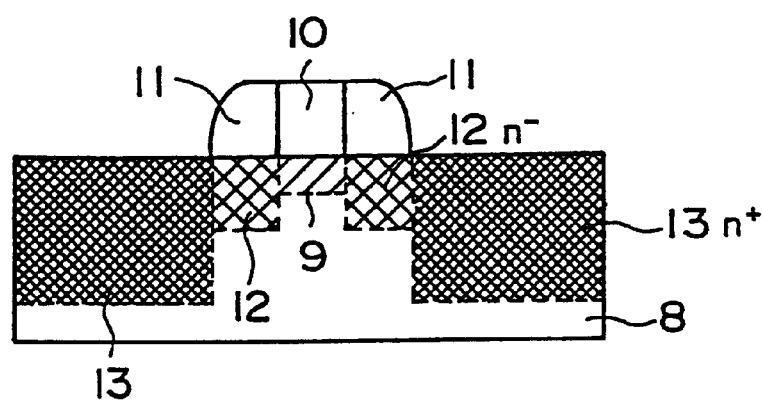

Next, in the step of FIG. 2B, an ion implantation of $Si^+$ is conducted into the substrate 8 while using the Schottky electrode 10 as a mask, to form a pair of n-type diffusion regions 12, and a side-wall insulation film 11 of $SiO_2$ is formed on each side wall of the Schottky electrode 10.

In the step of FIG. 2B, a further ion implantation process of $Si^+$ is conducted into the substrate 9 while using the Schottky electrode 10 and the side-wall insulation films 12 as a mask, to form a pair of n⁺-type diffusion regions 13 at respective outer sides of the diffusion regions 12.

It should be noted that the ion implantation process of $Si^+$ for forming the $n^-$-type diffusion regions 12 may be formed after the formation of the side-wall insulation films 11. In this case, the dose of Si into the $n^-$-type diffusion regions 12 is inevitably reduced as compared with the dose of the $n^+$-type diffusion regions 13.

Figure 2C:
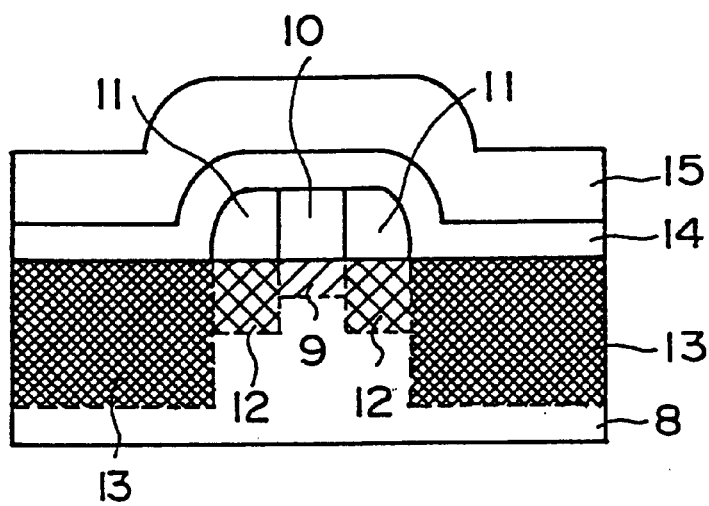

Next, in the step of FIG. 2C, a stress-relaxation layer 14 and a low-resistance layer 15 are deposited on the structure of FIG. 2B consecutively, followed by a thermal annealing process conducted typically at 800° C. for 25 minutes for activating the diffusion regions 12 and 13.

Figure 2D:
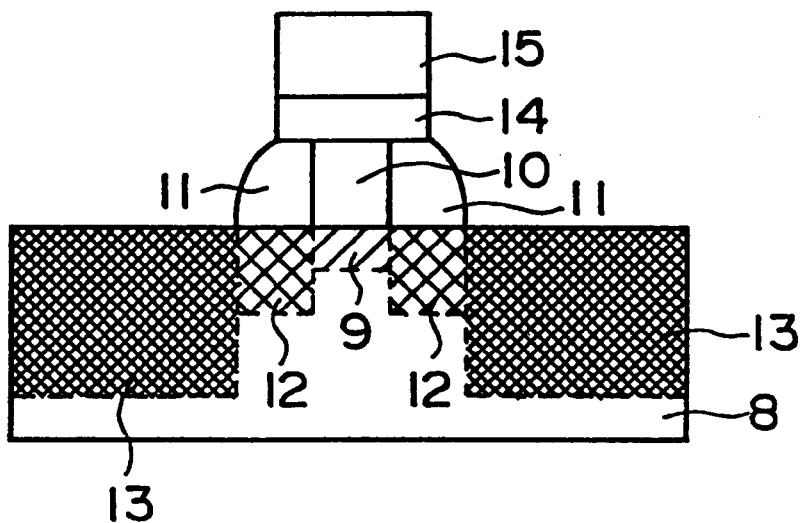

Next, in the step of FIG. 2D, the stress-relaxation layer 14 and the low-resistance layer 15 are subjected to a patterning process by using an ordinary photoresist process such that the layers 14 and 15 form a structure having a size W larger than the size of the Schottky electrode 11 but smaller than the total size of the gate structure including the side-wall insulation films 11. The foregoing patterning process of the layers 14 and 15 is conducted by an etching process that uses the side-wall insulation films 11 as an etching stopper.

Figure 2E:
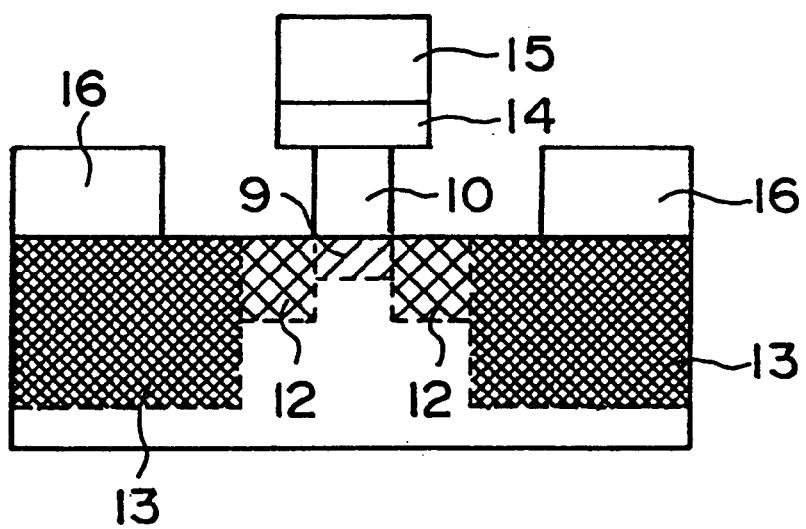

Next, in the step of FIG. 2E, an ohmic electrode 16 is formed on the $n^+$-type region 13 by a vapor phase deposition process. In the example of FIG. 2E, the side-wall insulation films 11 are removed, while it is also possible to retain the side-wall insulation films 11 as represented in FIG. 2D.

According to the present invention, the ion implantation process for forming the diffusion regions 12 is conducted directly, without causing the $Si^+$ ions to penetrate through the stress-relaxation layer 14 or the low-resistance layer 15. Thereby, the LDD structure of the semiconductor device is formed easily. As the Schottky electrode 10 is formed by the ordinary photoresist process, the gate length of the Schottky electrode 10 is controlled as desired, contrary to the case of forming the Schottky electrode 10 by a lateral etching process, and the inspection of the gate length during the fabrication process of the device is facilitated substantially. The gate length of the Schottky electrode 10 thus formed does not change even when the patterning process of the layers 14 and 15 as conducted and the problem of the variation of threshold voltage of the semiconductor device is effectively avoided. It should be noted that the Schottky electrode 10 is laterally protected by the side-wall insulation films 11 in the process of patterning the layers 14 and 15.

As a result of the foregoing process, the Schottky electrode 10, the stress-relaxation layer 14 and the low-resistance layer 15 form a T-shaped gate structure, wherein such a T-shaped gate structure is effective for reducing the gate resistance.

[FIRST EMBODIMENT]

FIGS. 3A–3G show a fabrication process of a MESFET having an LDD structure according to a first embodiment of the present invention.

Figure 3A:
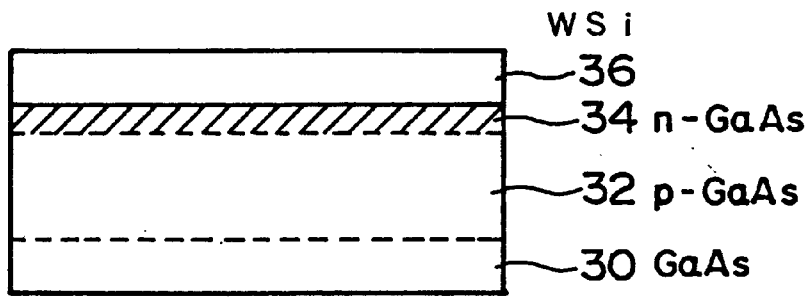
FIGS. 3A–3G are diagrams showing a fabrication process of a semiconductor device according to a first embodiment of the present invention.

Referring to FIG. 3A, a semi-insulating GaAs substrate 30 is subjected to an ion implantation process of $Mg^+$ to form a p-type GaAs layer 32 on the substrate 30. Next, an ion implantation process of $Si^+$ is conducted into a top part of the GaAs layer 32 to form an n-type channel layer 34 of GaAs, and a WSi layer 36 is deposited on the GaAs layer 34 by a sputtering process.

Figure 3B:
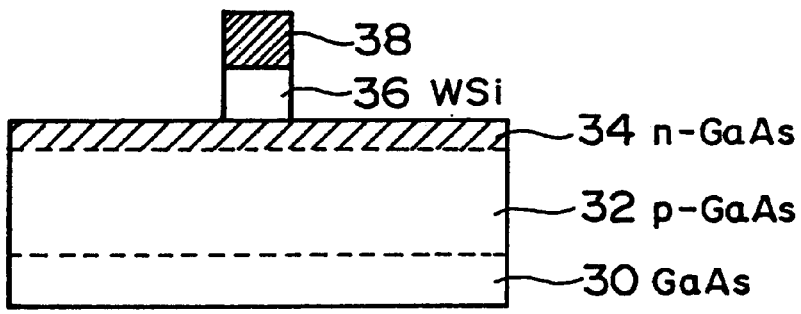

Next, in the step of FIG. 3B, a photoresist pattern 38 is formed on the WSi layer 36, and the WSi layer 36 is patterned in conformity with the shape of the photoresist pattern 38, to form a gate electrode represented hereinafter by the reference numeral 36.

Figure 3C:
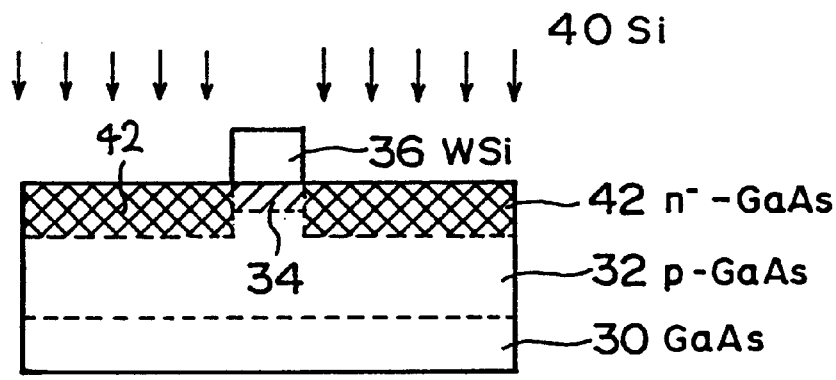

Next, in the step of FIG. 3C, the photoresist pattern 38 is removed by an ashing process and an ion implantation process 40 of $Si^+$ is conducted while using the WSi gate electrode 36 as a mask. Thereby, a pair of $n^-$-type diffusion regions 42 are formed in the top part of the p-type GaAs layer 32 at both lateral sides of the gate electrode 36.

Figure 3D:
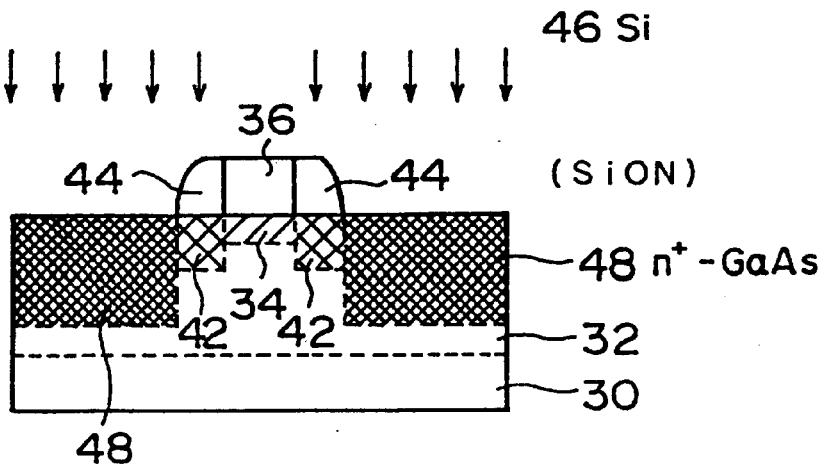

Next, in the step of FIG. 3D, a pair of side-wall insulation films 44 are formed on the WSi gate electrode 36 at respective side walls, wherein the side-wall insulation films 44 are formed by depositing an SiON film uniformly on the structure of FIG. 3C by a plasma CVD process, followed by an etch back process conducted in a direction substantially perpendicularly to the substrate 30. It should be noted that the SiON film thus deposited may be used also for a surface protection film at the time of the thermal annealing process. Further, it is possible to adjust the stress in the film by adjusting the ratio of 0 and N in the film 44.

After the formation of the side-wall insulation films 44, an ion implantation of $Si^+$ is conducted into the p-type GaAs layer 32 while using the gate electrode 36 and the side-wall insulation films 44 as a mask, to form $n^+$-type diffusion regions 48 in the layer 32 at respective outer sides of the side-wall insulation films 44.

Figure 3E:
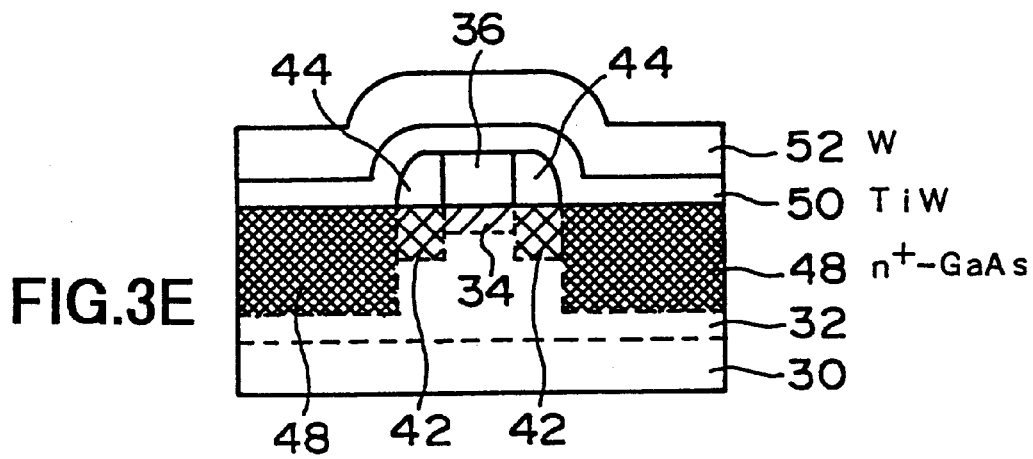

Next, in the step of FIG. 3E, a TiW layer 50 and a W layer 52 are deposited consecutively on the structure of FIG. 3D with respective thicknesses of 100 nm and 400 nm as a stress-relaxation layer and a low-resistance layer, followed by a thermal annealing process conducted in the state that the layers 50 and 52 cover the substrate 30, to activate the diffusion regions thus formed. Typically, the thermal annealing process is conducted at about 800° C. for about 25 minutes. It should be noted that the TiW layer 50 is a refractory conductive layer widely used in Si-LSIs as barrier layers, wherein the TiW layer 50 is effective for a protective film in such a thermal annealing process.

In the step of FIG. 3E, the stress in the TiW layer 50 can be adjusted by adjusting the condition of sputtering. It should be noted that a TiW layer deposited by a sputtering process has a fine columnar texture characterized by resiliency, and thus, the TiW layer 50 can absorb the stress induced therein as a result of the difference in the thermal annealing process between the TiW layer 50 and the WSi gate electrode 36 or between the TiW layer 50 and the W layer 52. The TiW layer 50 is preferably sputtered under the pressure of 10–20 mTorr and the DC bias of 1.0–2.0 kW.

Figure 3F:
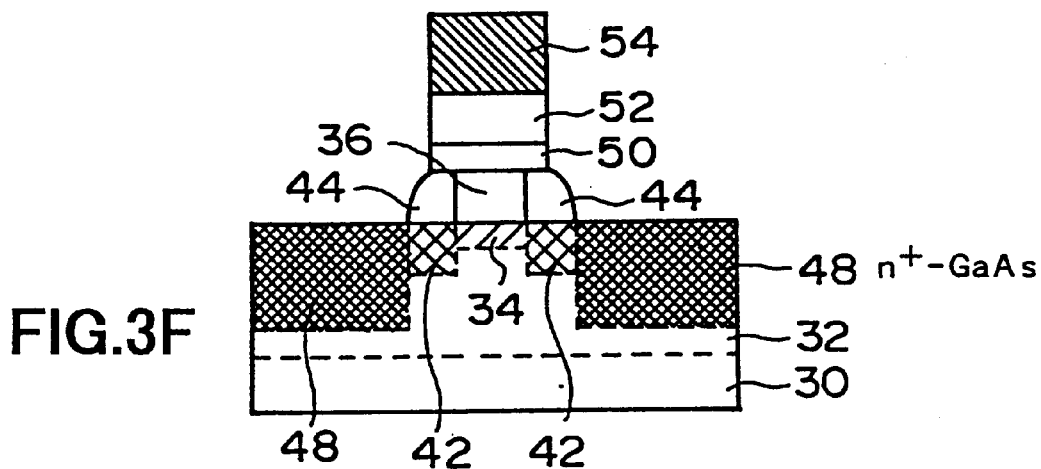

Next, in the step of FIG. 3F, a photoresist pattern 54 having a size larger than the size of the WSi layer 36 but smaller than the total gate size that includes the gate electrode 36 and the side-wall insulation films 44, is provided on the W layer 52 in correspondence to the gate electrode 36, and the W layer 52 and the WSi stress-relaxation layer 50 are patterned consecutively by a dry etching process while using the photoresist pattern 54 as a mask. In this process, it should be noted that the gate electrode 36 is effectively protected from etching including lateral etching by the side-wall insulation films 44.

Figure 3G:
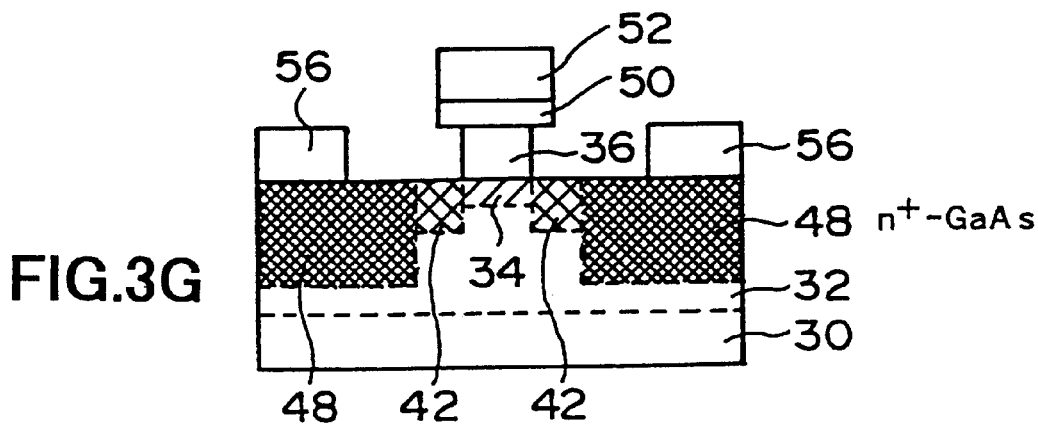

Finally, in the step of FIG. 3G, the side-wall insulation films 44 are removed for minimizing the gate stray capacitance, and ohmic electrodes 56 are provided on the $n^+$-type diffusion regions 48.

It should be noted that the semiconductor device of FIG. 3G has a T-shaped gate suitable for minimizing the gate resistance,. wherein the TiW layer 50 and the W layer 52 form an overhang structure above the gate electrode 36.

[SECOND EMBODIMENT]

FIGS. 4A–4G show a fabrication process of a MESFET according to a second embodiment of the present invention.

Figure 4A:
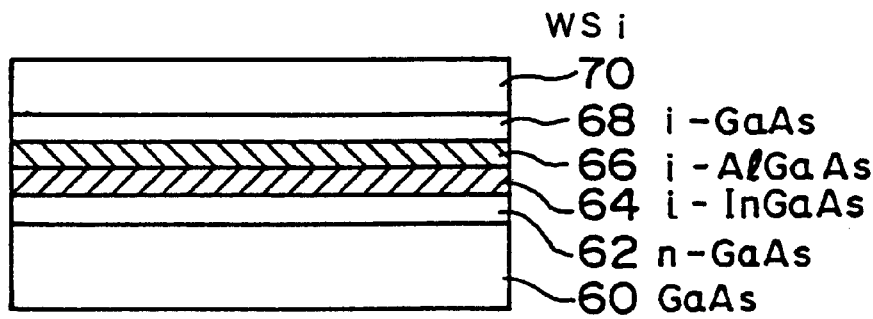

Referring to FIG. 4A, a GaAs layer 62 of the n-type, an undoped InGaAs layer 64, an undoped AlGaAs layer 66, and an undoped GaAs layer 68 are deposited consecutively on a semi-insulating GaAs substrate 60 by an epitaxial process such as an MOVPE process or MBE process, wherein the n-type GaAs layer 62 forms an electron supplying layer while the undoped InGaAs layer 64 forms a channel layer. In operation, the n-type GaAs layer 62 supplies electrons to the channel layer 64 of the undoped InGaAs. Further, a WSi layer 70 is deposited on the undoped GaAs layer 68 by a sputtering process as a Schottky electrode layer.

Figure 4B:
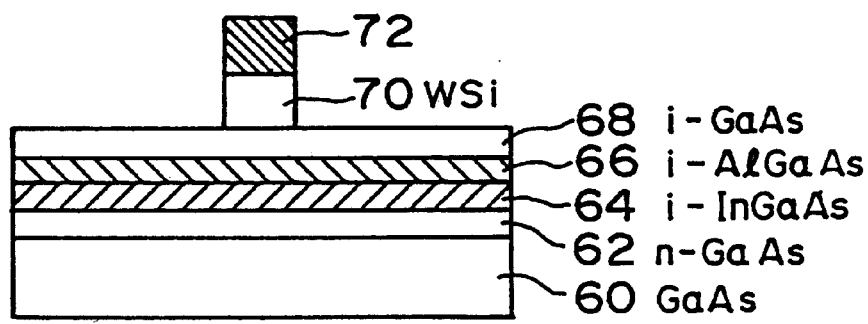

Next, in the step of FIG. 4B, the WSi layer 70 is patterned while using a photoresist pattern 72 as a mask, to form a WSi gate electrode designated hereinafter by the reference numeral 70.

Figure 4C:
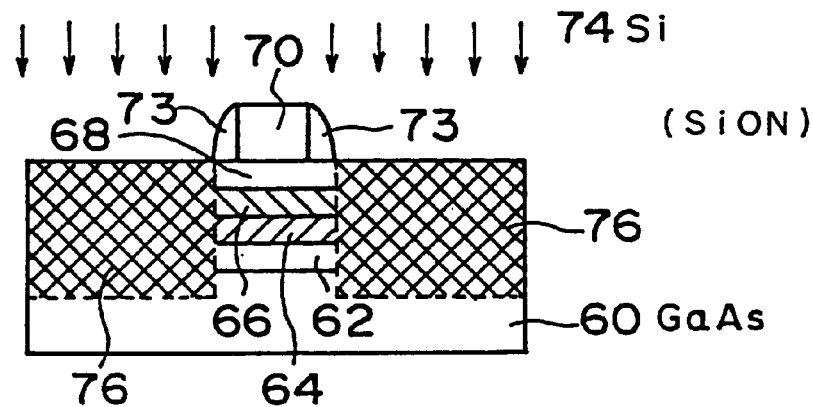

Next, in the step of FIG. 4C, a pair of first side-wall insulation films 73 of SiON are formed at respective side walls of said gate electrode 70 and an ion implantation process 74 of $Si^+$ is conducted into the substrate 60 while using the gate electrode 70 and the both side-wall insulation films 73 to form a pair of $n^-$-type diffusion regions 76 in the substrate 60. In the example of FIG. 4C, it should be noted that the $n^-$-type diffusion regions 76 penetrate through the layers 68–62 and reach the substrate 60. In such a construction, it should be noted that the ion implantation of $Si^+$ does not occur in the undoped GaAs layer 68 for the part right underneath the side-wall insulation films 73, and the leakage current between the gate electrode 70 and the $n^-$-type diffusion region 76 is minimized. Thereby, the reverse withstand voltage of the Schottky junction is substantially improved. Further, the effect of the LDD structure is enhanced and the short-channel effect is suppressed effectively.

Figure 4D:
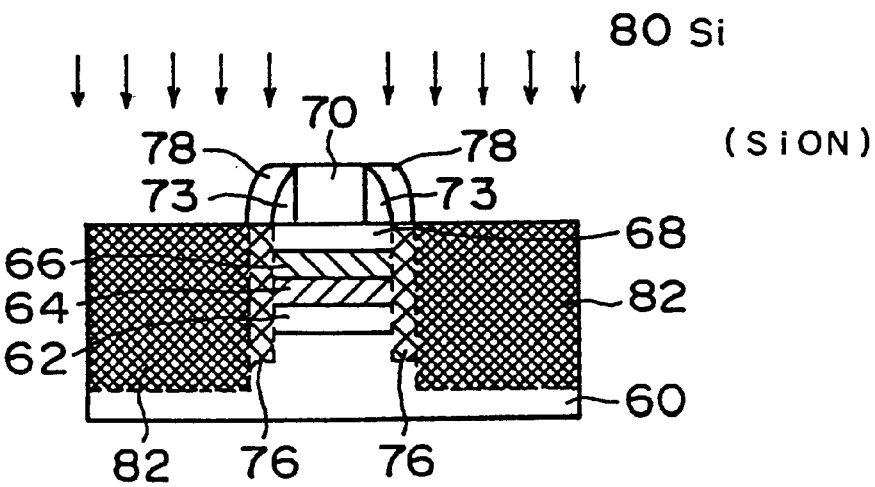

Next, in the step of FIG. 4D, a pair of second side-wall insulation films 78 of SiON are formed at respective outer-sides of the first side-wall insulation films 73, and an ion implantation process 80 of $Si^+$ is conducted while using the gate electrode 70, the side-wall insulation films 73 and the side-wall insulation films 78 as a mask, to form a pair of diffusion regions 82 of the $n^+$-type at respective outer-sides of the side-wall insulation films 78. As a result, an LDD structure characterized by the $n^-$-type region 76 interposed between the $n^+$ type region 82 and the gate electrode 70 is formed.

Next, in the step of FIG. 4E, a TiW layer 84 and a W layer 80 are deposited consecutively on the structure of FIG. 4D by a sputtering process respectively as a stress-relaxation layer and a low-resistance layer, followed by a thermal annealing process conducted while using the layers 84 and 86 as protective layers, to activate the diffusion regions thus formed.

Next, in the step of FIG. 4F, a photoresist pattern 88 having a size larger than the size of the WSi layer 70 but smaller than the total gate size that includes the gate electrode 706 and the side-wall insulation films 73 and 78, is provided on the W layer 86 in correspondence to the gate electrode 70, and the W layer 86 and the WSi stress-relaxation layer 84 are patterned consecutively by a dry etching process while using the photoresist pattern 54 as a mask. In this process, it should be noted that the gate electrode 70 is effectively protected from etching including lateral etching, by the side-wall insulation films 78.

Finally, in the step of FIG. 4G, the side-wall insulation films 78 and 73 are removed for minimizing the gate stray capacitance, and ohmic electrodes 90 are provided on the $n^+$-type diffusion regions 82.

It should be noted that the semiconductor device of FIG. 4G has a T-shaped gate suitable for minimizing the gate resistance, wherein the TiW layer 84 and the W layer 86 form an overhang structure above the gate electrode 70.

[THIRD EMBODIMENT]

FIGS. 5A–5G show a fabrication process of a MESFET according to a third embodiment of the present invention.

Figure 5A:
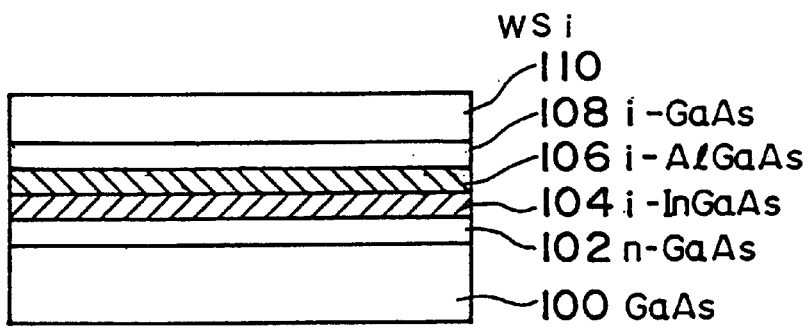
FIGS. 5A–5G are diagrams showing a fabrication process of a semiconductor device according to a third embodiment of the present invention.

Referring to FIG. 5A, a GaAs layer 102 of the n-type, an undoped InGaAs layer 104, an undoped AlGaAs layer 106, and an undoped GaAs layer 108 are deposited consecutively on a semi-insulating GaAs substrate 100 by an epitaxial process such as an MOVPE process or MBE process similarly to the case of the previous embodiment, wherein the n-type GaAs layer 102 forms an electron supplying layer while the undoped InGaAs layer 104 forms a channel layer. In operation, the n-type GaAs layer 102 supplies electrons to the channel layer 104 of the undoped InGaAs. Further, a WSi layer 110 is deposited on the undoped GaAs layer 108 by a sputtering process as a Schottky electrode layer.

Figure 5B:
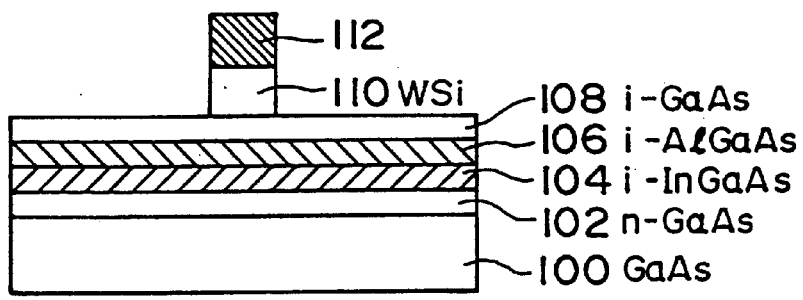

Next, in the step of FIG. 5B, the WSi layer 110 is patterned while using a photoresist pattern 112 to form a WSi gate electrode designated hereinafter by the reference numeral 110.

Figure 5C:
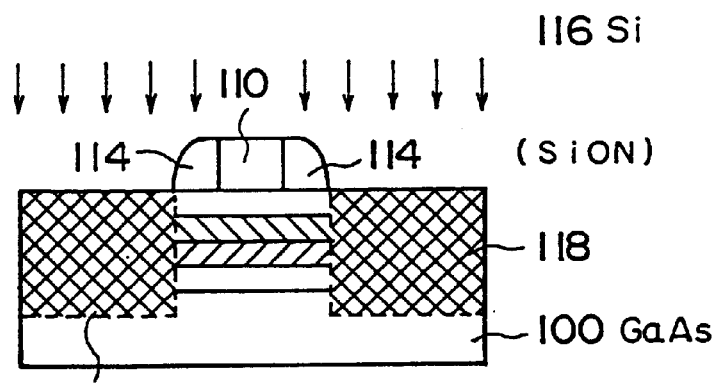

Next, in the step of FIG. 5C, a pair of first side-wall insulation films 114 of SiON are formed at respective side walls of said gate electrode 110 and an ion implantation process 116 of $Si^+$ is conducted into the substrate 100 while using the gate electrode 110 and the both side-wall insulation films 114 to form a pair of $n^-$-type diffusion regions 118 in the substrate 100. In the example of FIG. 5C, it should be noted that the $n^-$-type diffusion regions 118 penetrate through the layers 108–102 and reach the substrate 100. In such a construction, it should be noted that the ion implantation of $Si^+$ does not occur in the undoped GaAs layer 108 for the part right underneath the side-wall insulation films 114, and the leakage current between the gate electrode 110 and the $n^-$-type diffusion region 118 is minimized. Thereby, the reverse withstand voltage of the Schottky junction is substantially improved. Further, the effect of the LDD structure is enhanced and the short-channel effect is suppressed effectively.

Figure 5D:
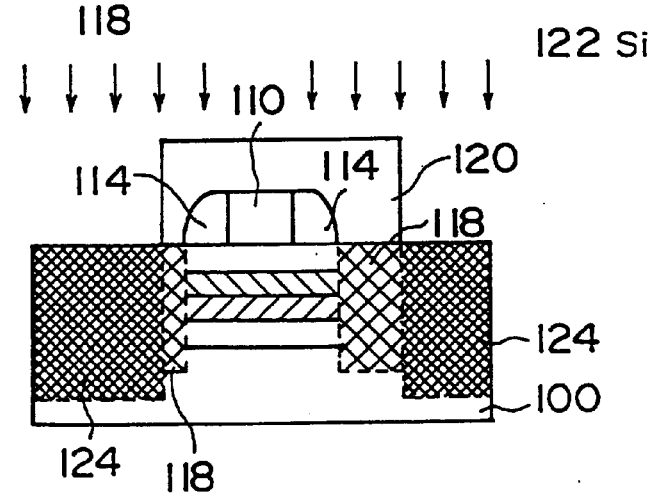

Next, in the step of FIG. 5D, a resist pattern 120 is formed on the layer 108 so as to protect the gate electrode 110 including the side-wall insulation films 114, and an ion implantation process 122 of $Si^+$ is conducted while using the resist pattern 112 as a mask, to form a pair of diffusion regions 124 of the $n^+$-type at respective outer-sides of the side-wall insulation films 114. As a result, an LDD structure characterized by the $n^-$-type region 118 interposed between the $n^+$-type region 124 and the gate electrode 110 is formed.

In the step of FIG. 5D, it should be noted that the resist pattern 120 is provided with an offset in the gate-length direction with respect to the gate electrode 110 (asymmetric in the gate-length direction with respect to the gate electrode 110), such that the $n^-$-type diffusion region 118 has an increased length at the side of the drain region and a decreased length at the side of the source region. By doing so, the concentration of electric field in the drain region is successfully avoided and the problem of hot carrier formation is suppressed. Thereby, the problem of short channel effect is reduced. Further, as a result of forming the length of the $n^-$-type diffusion region 118 at the side of the source region, the source resistance of the device is reduced and the transconductance of the MESFET is improved.

Figure 5E:
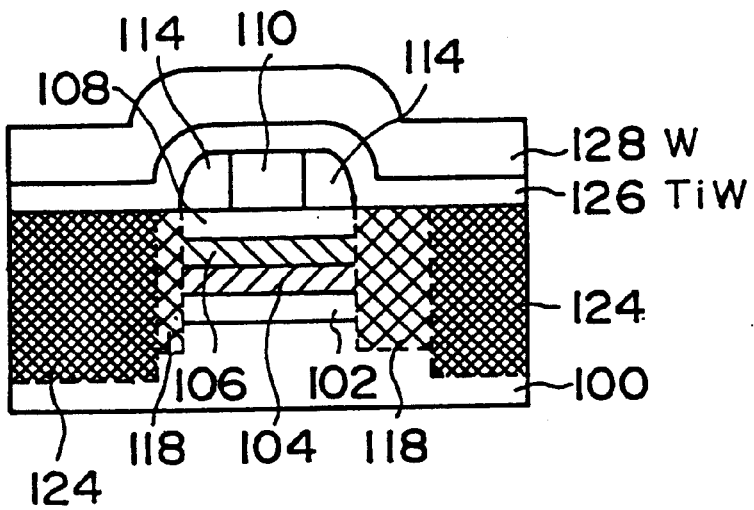

Next, in the step of FIG. 5E, a TiW layer 126 and a W layer 128 are deposited consecutively on the structure of FIG. 5D by a sputtering process respectively as a stress-relaxation layer and a low-resistance layer, followed by a thermal annealing process conducted while using the layers 126 and 128 as protective layers, to activate the diffusion regions thus formed. Typically, the thermal annealing process is conducted at about 800° C. for 25 minutes.

Figure 5F:
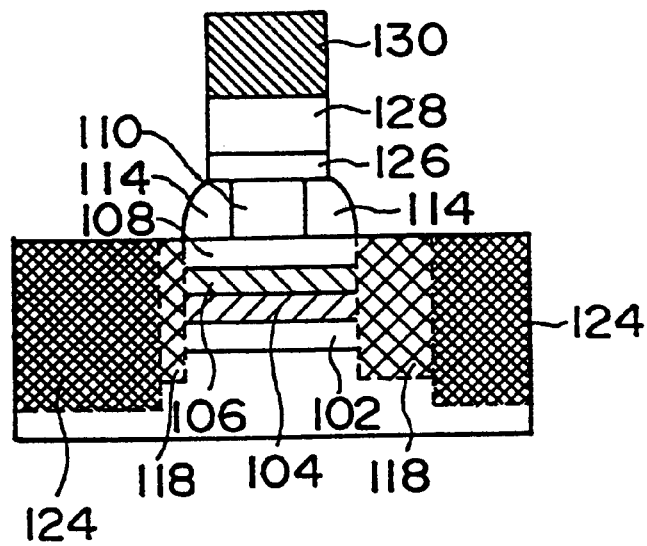

Next, in the step of FIG. 5F, a photoresist pattern 130 having a size larger than the size of the WSi layer 110 but smaller than the total gate size that includes the gate electrode 110 and the side-wall insulation films 114, is provided on the W layer 128 in correspondence to the gate electrode 110, and the W layer 128 and the WSi stress-relaxation layer 126 are patterned consecutively by a dry etching process while using the photoresist pattern 130 as a mask. In this process, it should be noted that the gate electrode 110 is effectively protected from etching including lateral etching, by the side-wall insulation films 114.

Figure 5G:
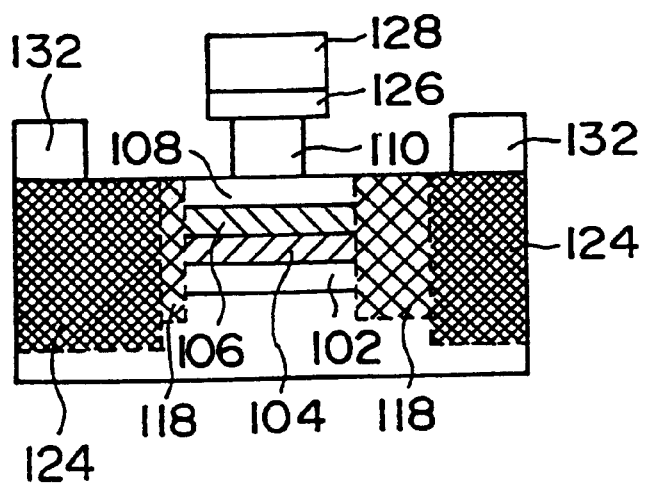

Finally, in the step of FIG. 5G, the side-wall insulation films 114 are removed for minimizing the gate stray capacitance, and ohmic electrodes 132 are provided on the n$^+$-type diffusion regions 124.

It should be noted that the semiconductor device of FIG. 5G has a T-shaped gate suitable for minimizing the gate resistance, wherein the TiW layer 126 and the W layer 128 form an overhang structure above the gate electrode 110.

[FOURTH EMBODIMENT]

FIGS. 6A–6E show a fabrication process of a MESFET having an LDD structure according to a fourth embodiment of the present invention.

Figure 6A:
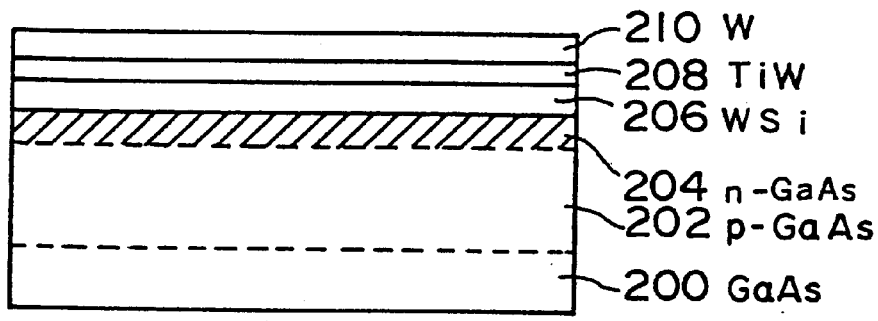
FIGS. 6A–6E are diagrams showing a fabrication process of a semiconductor device according to a fourth embodiment of the present invention.

Referring to FIG. 6A, a semi-insulating GaAs substrate 200 is subjected to an ion implantation process of Mg$^+$ to form a p-type GaAs layer 202 on the substrate 200. Next, an ion implantation process of Si$^+$ is conducted into a top part of the GaAs layer 202 to form an n-type channel layer 204 of GaAs, and a WSi layer 206 is deposited on the GaAs layer 204 by a sputtering process.

Further, a TiW layer 208 forming a stress-relaxation layer and a W layer 210 forming a low-resistance layer are deposited consecutively on the WSi layer 206 in the step of FIG. 6A by a sputtering process.

Figure 6B:
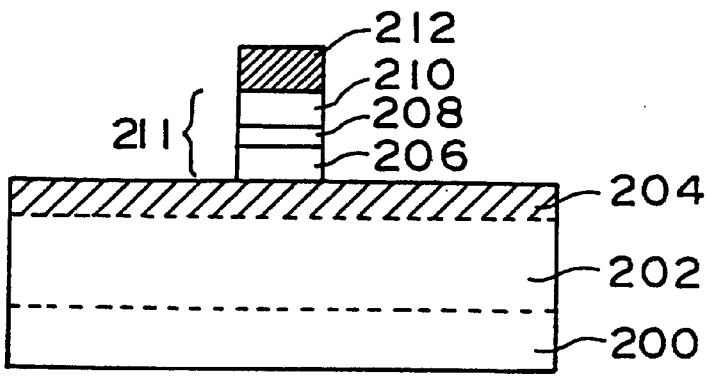

Next, in the step of FIG. 6B, a photoresist pattern 212 is formed on the W layer 210, and the layers 210–206 are patterned in conformity with the shape of the photoresist pattern 212, to form a gate electrode structure 211.

Figure 6C:
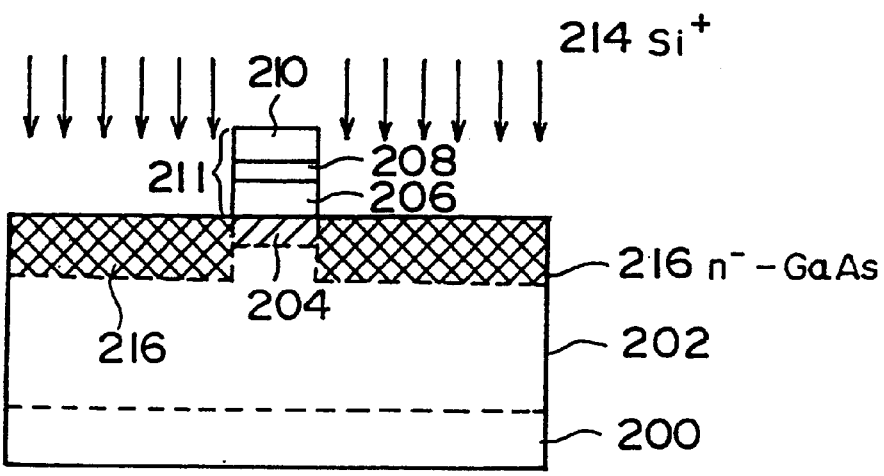

Next, in the step of FIG. 6C, the photoresist pattern 212 is removed by an ashing process and an ion implantation process 214 of Si$^+$ is conducted while using the gate electrode structure 211 as a mask. Thereby, a pair of n$^-$-type diffusion regions 216 are formed in the top part of the p-type GaAs layer 202 at both lateral sides of the gate electrode structure 211.

Figure 6D:
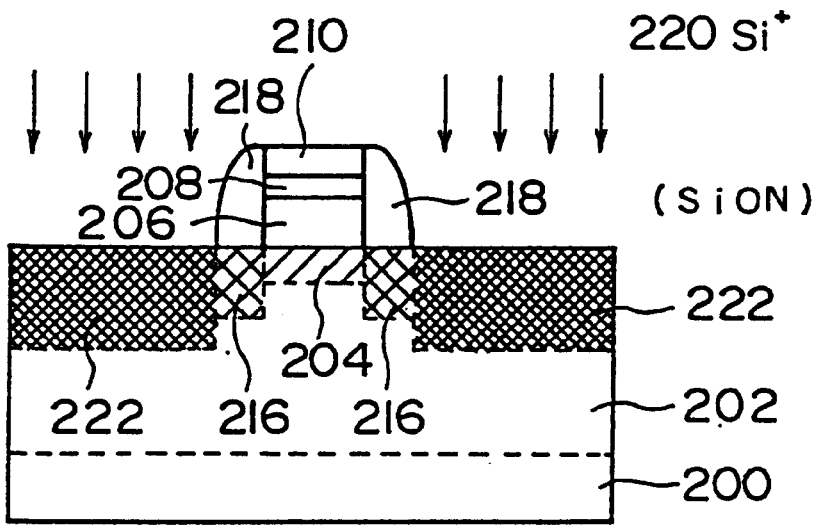

Next, in the step of FIG. 6D, a pair of side-wall insulation films 218 are formed on the gate electrode structure 211 at respective side walls, wherein the side-wall insulation films 218 are formed by depositing an SiON film uniformly on the structure of FIG. 6C by a plasma CVD process, followed by an etch back process conducted in a direction substantially perpendicularly to the substrate 200.

After the formation of the side-wall insulation films 218, an ion implantation of Si$^+$ is conducted into the p-type GaAs layer 200 while using the gate electrode 211 and the side-wall insulation films 218 as a mask, to form n$^+$-type diffusion regions 222 in the layer 202 at respective outer sides of the side-wall insulation films 218.

Figure 6E:
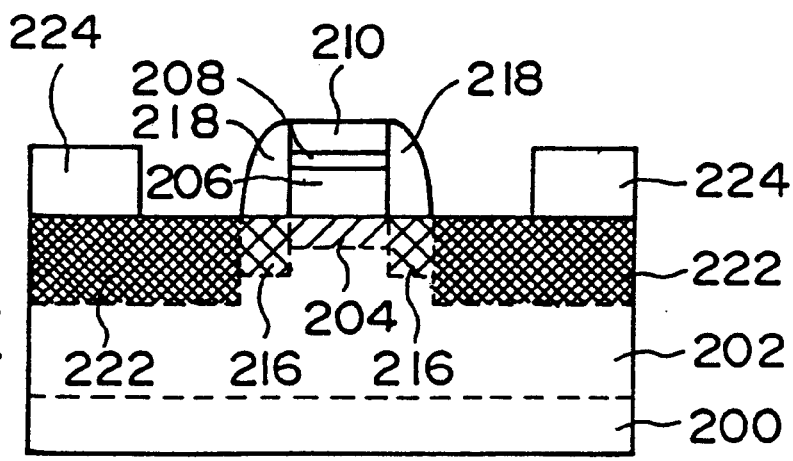

Next, in the step of FIG. 6E, a thermal annealing process is conducted to activate the diffusion regions 216 and 222, and ohmic electrodes 224 are provided on the n$^+$-type diffusion regions 222.

It should be noted that the MESFET of FIG. 6G has an LDD structure and simultaneously includes the stress-relaxation layer 208 in the gate electrode structure 211.

Further, the present invention is not limited to the embodiments described heretofore, but various variations and modifications may be made without departing from the scope of the invention.

What is claimed is:

1. A method of fabricating a semiconductor device, comprising the steps of:

forming a gate electrode on a substrate;

introducing a first impurity element into said substrate while using said gate electrode as a mask;

forming a first side-wall insulation film on said gate electrode so as to cover a side wall thereof;

introducing a second impurity element, identical in conductivity type with said first impurity element, into said substrate while using said gate electrode and said first side-wall insulation film as a mask;

depositing, on said gate electrode and said side-wall insulation film, a stress-relaxation layer and a low-resistance layer consecutively; and patterning said stress-relaxation layer and said low-resistance layer such that said stress-relaxation layer and said low-resistance layer form an overhang with respect to said gate electrode.

2. A method as claimed in claim 1, wherein said step of introducing said first impurity element is conducted after said step of forming a second side-wall insulation film on said side wall of said gate electrode, and wherein said step of forming said first side-wall insulation film is conducted after said step of forming said second side-wall insulation film, such that said first side-wall insulation film covers said second side-wall insulation film.

3. A method of fabricating a compound semiconductor device comprising the steps of:

forming a gate electrode on a substrate;

forming a pair of side-wall insulation films on both side walls of said gate electrode;

forming a pair of first diffusion regions in said substrate by introducing a first impurity element by an ion implantation process while using said gate electrode and said side-wall insulation films as a mask;

forming a pair of second diffusion regions in said substrate respectively at both sides of said gate electrode with a separation from a corresponding side-wall insulation film, such that each of said second diffusion regions overlaps partially with a corresponding first diffusion region, said step of forming said second diffusion regions including a step of introducing a second impurity element of a conductivity type identical with a conductivity type of said first impurity element while using a mask covering said gate electrode and said pair of side-wall insulation films, said mask being formed such that a first region of said first diffusion region located at a first side in a gate-length direction with respect to said gate electrode has a size different from a size of a second region of said first diffusion region located at a second, opposite side of said gate electrode.

4. A method of fabricating a semiconductor device, comprising the steps of:

forming a gate electrode on a substrate by depositing a metal layer forming a Schottky contact with said substrate, a stress-relaxation layer and a low-resistance layer consecutively;

introducing a first impurity element into said substrate while using said gate electrode as a mask;

forming a side-wall insulation film on a side wall of said gate electrode; and introducing a second impurity element having an identical conductivity type with a conductivity type of said first impurity element while using said gate electrode and said side-wall insulation film as a mask.

* * * * *